(12) United States Patent
Yanagihara et al.

(10) Patent No.: US 7,148,557 B2
(45) Date of Patent: Dec. 12, 2006

(54) BIPOLAR TRANSISTOR AND METHOD FOR FABRICATING THE SAME

(75) Inventors: Manabu Yanagihara, Osaka (JP); Naohiro Tsurumi, Osaka (JP); Tsuyoshi Tanaka, Osaka (JP); Daisuke Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/650,702

(22) Filed: Aug. 29, 2003

(65) Prior Publication Data

US 2004/0041235 A1    Mar. 4, 2004

(30) Foreign Application Priority Data

Aug. 29, 2002 (JP) ............................. 2002-250885

(51) Int. Cl.
    *H01L 27/082* (2006.01)
(52) U.S. Cl. .................... 257/577; 257/587; 257/198
(58) Field of Classification Search ................ 257/565, 257/577, 587, 532, 197, 198
See application file for complete search history.

(56) References Cited

U.S. PATENT DOCUMENTS

| | | | |
|---|---|---|---|
| 5,001,534 A * | 3/1991 | Lunardi et al. ............. | 257/197 |
| 5,608,353 A | 3/1997 | Pratt | |
| 5,629,648 A | 5/1997 | Pratt | |
| 5,760,457 A * | 6/1998 | Mitsui et al. ............... | 257/582 |
| 5,861,640 A * | 1/1999 | Gomi ......................... | 257/197 |
| 6,462,362 B1 * | 10/2002 | Miyoshi ..................... | 257/198 |
| 6,593,604 B1 * | 7/2003 | Ishimaru .................... | 257/197 |
| 6,936,871 B1 * | 8/2005 | Hase .......................... | 257/198 |
| 2004/0041235 A1 * | 3/2004 | Yanagihara et al. ........ | 257/565 |

FOREIGN PATENT DOCUMENTS

JP         08-279561         10/1996

OTHER PUBLICATIONS

American Heritage Dictionary, Second College Edition (1982), p. 872.*

* cited by examiner

*Primary Examiner*—Mark V. Prenty
(74) *Attorney, Agent, or Firm*—McDermott Will & Emery LLP

(57) ABSTRACT

A bipolar transistor includes: a first semiconductor layer having an intrinsic base region and an extrinsic base region; and a second semiconductor layer having a portion located on the intrinsic base region to be an emitter region or a collector region. A capacitive film is provided on the extrinsic base region using the same semiconductor material as that for the second semiconductor layer. A base electrode is formed on the first semiconductor layer to cover the capacitive film and the extrinsic base region.

11 Claims, 11 Drawing Sheets

BIPOLAR TRANSISTOR AND METHOD FOR FABRICATING THE SAME

BACKGROUND OF THE INVENTION

The present invention relates to bipolar transistors capable of being used as high power transistors using radio frequencies, and to methods for fabricating the same.

Group III–V compound semiconductors of, for example, gallium arsenide (GaAs) or indium phosphorus (InP) have the following advantages. For example, the Group III–V compound semiconductors exhibit excellent electrical characteristics in, for example, electron mobility and electron saturation velocity, as compared to silicon (Si)-based semiconductor materials. In addition, the Group III–V compound semiconductors can be used in designing semiconductor devices with desired energy band structures utilizing a heterojunction or can be used as semi-insulating substrates.

In particular, a heterojunction bipolar transistor (HBT) which uses, for its emitter layer, a Group III–V compound semiconductor having a wider band gap than the base layer exhibits characteristics such as being operable with a single power source, a high degree of efficiency in adding power, and an excellent linearity of power amplification. Accordingly, such HBTs have been widely used as high power transistors for cellular phones.

An aluminum gallium arsenide (AlGaAs)/GaAs-based HBT using p-type GaAs and n-type AlGaAs for its base and emitter layers, respectively, and an indium gallium phosphorus (InGaP)/GaAs-based HBT using p-type GaAs and n-type InGaP for its base and emitter layers, respectively, are known as conventional HBTs.

FIG. 10A shows a cross-sectional structure of a known InGaP/GaAs-based HBT. As shown in FIG. 10A, a collector contact layer 102 of high-concentration n-type GaAs, a collector layer 103 of low-concentration n-type GaAs, a base layer 104 of p-type GaAs, an emitter layer 105 of n-type InGaP, and an emitter contact layer 106 made of a stack of n-type emitter layers, are stacked in this order over a substrate 101 of GaAs.

An emitter electrode 107 is formed on the emitter contact layer 106. The emitter layer 105 is formed on the base layer 104 to have a mesa configuration. Base electrodes 108 are formed on the base layer 104 at the sides of the emitter layer 105. A collector electrode 109 is formed on the collector contact layer 102 at a side of the collector layer 103.

In the known HBT, since the emitter layer 105 is made of InGaP having a wider bandgap than the base layer 104, the backflow of holes from the base layer 104 to the emitter layer 105 can be suppressed. Therefore, the thickness of the base layer 104 can be reduced and, at the same time, the concentration of the p-type impurity can be increased. Accordingly, it is possible to increase flow time of electrons in the base layer 104, while suppressing the base resistance. As a result, the known HBT can be used as a power amplifier operable at high speed.

Now, in the known HBT, the emitter layer 105 with the mesa configuration includes: an emitter region 105a located under the emitter contact layer 106 and actually serving as an emitter; and a surface-protection region 105b connected to the emitter region 105a. The base layer 104 is divided into an intrinsic base region 104a located under the emitter region 105a and actually serving as a base and an extrinsic base region 104b connecting the base electrodes 108 and the intrinsic base region 104a together.

The surface-protection region 105b has a function of preventing recombination of holes and electrons injected from the emitter electrode 107 into the emitter region 105a through the emitter contact layer 106 in the surface of the extrinsic base region 104b.

FIG. 10B shows the emitter layer 105 and the peripheral portion thereof in FIG. 10A in an enlarged manner, by overlaying equivalent circuit symbols thereon. As shown in FIG. 10B, a positive direct current DC is input to each of the base electrodes 108 together with an RF input signal $RF_{IN}$, thereby using an amplified RF power of the input signal $RF_{IN}$. In this case, the base layer 104 is doped with a p-type impurity at a high concentration and the base layer 104 serves as a resistance to the direct current DC and input signal $RE_{IN}$.

In the case where the known HBT is applied to a high power device, about 10 to 100 HBTs are connected in parallel, taking the HBT shown in FIG. 10A as one unit cell. However, there are cases where the degree of temperature rise differs among the HBTs because of variation in operating state or the like. In such cases, the ON voltage between the emitter and the base decreases in some of the HBTs under high temperatures, so that the emitter current increases, thus causing further temperature rise. As a result, operation of the high power device becomes thermally unstable.

To solve the problem, a configuration in which a resistance element for stabilizing operation which is called a ballast resistance is provided to a base input terminal in each of the HBTs is known.

FIG. 11 shows a circuit configuration of a known high power device in which a ballast resistance is provided in each of the HBTs. As shown in FIG. 11, to respective base terminals of bipolar transistors $Q_1$ through $Q_n$, a direct current DC is input via ballast resistances $R_1$ through $R_n$ and an input signal $RF_{IN}$ is input via input capacitances $C_1$ through $C_n$.

With such a configuration, if current tends to be concentrated in one of the bipolar transistors, e.g., bipolar transistor $Q_1$, voltage drop is caused by the ballast resistance $R_1$. Accordingly, the voltage applied at the base layer decreases, thus making the current less concentrated. In addition, since the input signal $RF_{IN}$ is input to the base electrodes via the input capacitances $C_1$ through $C_n$, the ballast resistances $R_1$ through $R_n$ cause no deterioration of the RF characteristic.

The high power device shown in FIG. 11 is obtained by forming the bipolar transistors $Q_1$ through $Q_n$ having the same configuration as that of the HBT shown in FIG. 10A. In this case, the ballast resistances $R_1$ through $R_n$ are formed in part of the substrate other than a region in which an HBT is to be formed by using a thin film of a metal or a semiconductor material, and the input capacitances $C_1$ through $C_n$ are formed by using a capacitive insulating film of, for example, silicon nitride (SiN) and a conductor film of a metal.

However, in the known HBT, provision of the surface-protection region 105b increases the distance between the base electrodes 108 and the emitter electrode 107, so that the base resistance increases. Accordingly, current of an input signal input from the base electrodes 108 decreases to a larger extent, resulting in deterioration in the RF characteristic of the HBT.

In addition, as in the known high power device, provision of the input capacitances $C_1$ through $C_n$ and the ballast resistances $R_1$ through $R_n$ to the bipolar transistors $Q_1$ through $Q_n$ needs securing an input capacitance region and a ballast resistance region as well as an HBT region. This increases the chip area, thus increasing the cost for a chip. In particular, if nitride silicon is used for a capacitive insulating film, a rectangular region with sides of 10 μm or more is required for every HBT in order to secure a capacitive value required as an input capacitance, resulting in that the cost for a chip remarkably increases. In addition, it is also necessary to form ballast resistances and input capacitances after forming HBTs, so that the manufacturing cost increases.

SUMMARY OF THE INVENTION

It is therefore an object of the present invention to obtain a bipolar transistor having an excellent thermal stability and an excellent RF characteristic without increasing the chip area and the manufacturing cost.

To achieve the object, an inventive bipolar transistor includes: a first semiconductor layer including an intrinsic base region and an extrinsic base region; a second semiconductor layer formed on the first semiconductor layer, part of the second semiconductor layer located on the intrinsic base region being to be an emitter region or a collector region; a capacitive film formed on the extrinsic base region of the first semiconductor layer; and a base electrode formed on the first semiconductor layer, part of the base electrode being located on the capacitive film, the other part of the base electrode being connected to the extrinsic base region.

In the inventive semiconductor device, an RF input signal input to the base electrode reaches the intrinsic base region through the capacitive film. Accordingly, the RF characteristic of the input signal does not deteriorate because of the resistance at the extrinsic base region. In addition, a capacitor can be provided within a region in which a bipolar transistor is to be formed, so that it is possible to provide the capacitor without increasing the chip area. Furthermore, direct current input to the base electrode reaches the intrinsic base region through the extrinsic base region. Accordingly, the resistance at the extrinsic base region can be used as a ballast resistance, thus improving the thermal stability of the bipolar transistor.

In the inventive bipolar transistor, the capacitive film and the second semiconductor layer are preferably made of an identical semiconductor material.

Then, the capacitive film needs no special dielectric material, thus fabricating a bipolar transistor with low cost.

In the inventive bipolar transistor, the capacitive film is preferably provided such that an end of the capacitive film at the side of the second semiconductor layer is in contact with a side of the second semiconductor layer.

Then, the capacitive film can be used as a surface-protection layer for preventing recombination between electrons and holes in the surface of the extrinsic base region. Accordingly, the current gain of the bipolar transistor can be increased.

In the inventive bipolar transistor, a high-resistance region having a resistance value higher than the intrinsic base region is preferably provided in the extrinsic base region.

Then, the resistance value at a path along which the direct current input to the base electrode flows through the external base region increases. Accordingly, the resistance value as a ballast resistance is secured sufficiently, thus ensuring improvement in thermal stability of the bipolar transistor.

In the inventive bipolar transistor, the capacitive film is preferably provided on part of the extrinsic base region located at a distance from an end of the extrinsic base region opposite to the intrinsic base region, and the base electrode is preferably provided on the extrinsic base region and the capacitive film to cover an end of the capacitive film opposite to the second semiconductor layer.

Then, part of the base electrode located at a relatively large distance from the intrinsic base region is connected to the extrinsic base region. Accordingly, it is possible to increase the distance of a path along which the direct current input to the base electrode flows through the extrinsic base region, thus securing a resistance value as a ballast resistance.

In the inventive bipolar transistor, the base electrode preferably includes: a first base electrode formed on the capacitive film; and a second base electrode provided at a distance from the first base electrode and connected to the extrinsic base region of the first semiconductor layer.

Then, no direct current is input to the base electrode through a side portion of the capacitive film, so that the amount of leakage current of the direct current can be reduced.

In the inventive bipolar transistor, the second base electrode is preferably made of a metallic material whose resistance value increases as the temperature rises.

Then, the value of the ballast resistance with respect to the direct current increases as the temperature rises. Accordingly, the thermal stability is further improved.

In the inventive bipolar transistor, the capacitive film is preferably provided on part of the extrinsic base region located at a distance from an end of the extrinsic base region opposite to the intrinsic base region, and the second base electrode is preferably provided on part of the capacitive film farthest from the intrinsic base region.

In the inventive bipolar transistor, the capacitive film is preferably formed on the first semiconductor layer to cover an end of the extrinsic base region opposite to the intrinsic base region, the first and second base electrodes are preferably provided on the capacitive film such that the second base electrode is located at a larger distance from the intrinsic base region than the first base electrode, and the second base electrode is preferably connected to the first semiconductor layer via the capacitive film.

In the inventive bipolar transistor, the second semiconductor layer is preferably made of a semiconductor material exhibiting a band gap wider than the first semiconductor layer.

In the inventive bipolar transistor, the first semiconductor layer is preferably made of a semiconductor material of a first conductivity type, and the capacitive film is preferably made of a semiconductor material of a second conductivity type.

An inventive method for fabricating a bipolar transistor includes the steps of: a) forming a first semiconductor layer and a second semiconductor layer in this order over a substrate; b) defining, in the second semiconductor layer, a first region to be an emitter region or a collector region and a second region to be a capacitive film; and c) forming a base electrode on the first semiconductor layer such that part of the base electrode is connected to the first semiconductor layer and the other part of the base electrode covers the second region.

With the inventive method for fabricating a bipolar transistor, part of the base electrode is connected to the first semiconductor layer and the other part is connected to the capacitive film, so that it is possible to provide a configuration in which an RF signal input to the base electrode reaches a portion to be an intrinsic base region through the capacitive film whereas a direct current input to the base electrode reaches the intrinsic base region through a portion to be an extrinsic base region. Accordingly, a bipolar transistor exhibiting an excellent RF characteristic and an excellent thermal stability can be achieved. In addition, a capacitive film is formed out of a second semiconductor layer for forming an emitter region or a collector region. Accordingly, it is possible to form the capacitor within a region in which a bipolar transistor is to be formed, without using a special dielectric material.

In the inventive method, the step b) preferably includes the steps of: forming a mask pattern covering the first region and the second region; and etching the second semiconductor layer using the mask pattern until the first semiconductor layer is exposed.

Then, a capacitive film can be formed simultaneously with the formation of an emitter region or a collector region out of the second semiconductor layer. Accordingly, it is possible to form a capacitor within a region in which a bipolar transistor is to be formed, without adding any special process step.

In the inventive method, in the step b), the mask pattern is preferably formed such that the first region and the second region are in contact with each other.

Then, the capacitive film can be formed as a surface-protection region for preventing recombination between electrons and holes from occurring in the surface of the extrinsic base region. Accordingly, the current gain of the bipolar transistor can be improved.

The inventive method preferably further includes the step of performing ion implantation on the exposed surface of the first semiconductor layer using the mask pattern, after the step b) has been performed.

Then, an ion implantation region in the first semiconductor layer is formed as a high-resistance region. Accordingly, the resistance value as a ballast resistance is secured sufficiently, thus ensuring improvement in thermal stability of the bipolar transistor.

In the inventive method, in the step c), the base electrode is preferably formed to cover the exposed surface of the first semiconductor layer and the second region of the second semiconductor layer.

Then, it is possible to form a base electrode such that part of the base electrode is connected to the first semiconductor layer and the other part is connected to the capacitive film, as intended.

In the inventive method, the step c) preferably includes the steps of forming a first base electrode to be connected to the first semiconductor layer; and forming a second base electrode on the second semiconductor layer.

In the inventive method, a metallic material whose resistance value increases as the temperature rises is preferably used as a material constituting the second base electrode.

In the inventive method, the step b) preferably includes the steps of forming a mask pattern covering the first region and the second region; and etching the second semiconductor layer using the mask pattern until the first semiconductor layer is exposed, wherein in the step c), the first base electrode is preferably formed on the second region of the second semiconductor layer, and the second base electrode is preferably formed on the exposed surface of the first semiconductor layer.

In the inventive method, in the step b), the second region is preferably defined to cover an end of the first semiconductor layer, and the step c) preferably includes the steps of: forming a first base electrode on the second region using a first metallic material; forming a second base electrode on the second region using a second metallic material such that the second base electrode is located at a larger distance from the first region than the first base electrode; and selectively diffusing the second metallic material so that the second base electrode and the first semiconductor layer are connected to each other.

In the inventive method, in the step a), a material exhibiting a band gap wider than the first semiconductor layer is preferably used as a material constituting the second semiconductor layer.

DESCRIPTION OF THE PREFERRED EMBODIMENTS

Embodiment 1

A bipolar transistor according to a first embodiment of the present invention will be described with reference to the drawings.

Figure 1A:
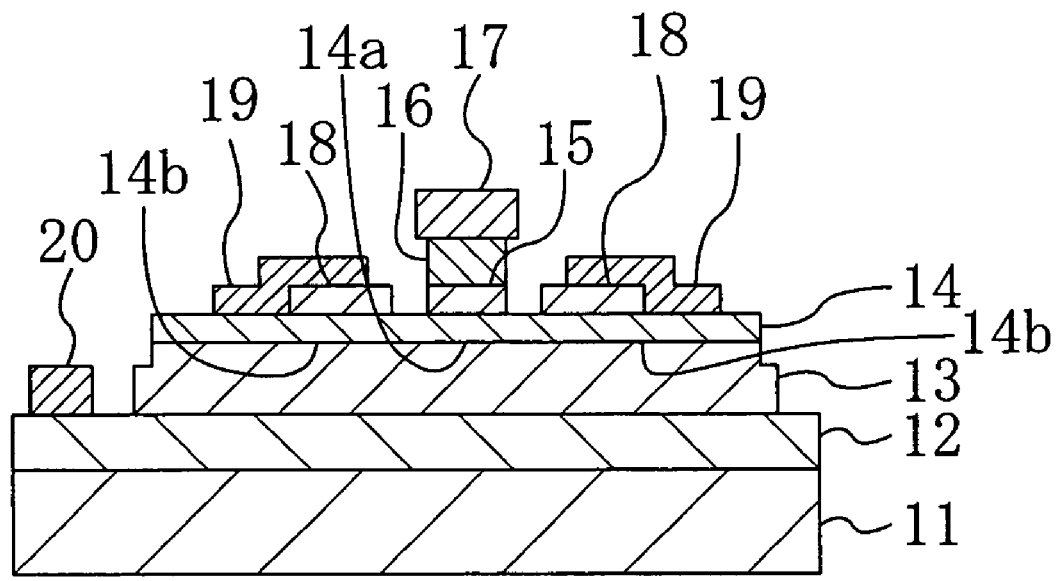
FIG. 1A is a cross-sectional view showing a structure of a bipolar transistor according to a first embodiment of the present invention.

FIG. 1A is a cross-sectional view showing a structure of a bipolar transistor of the first embodiment. As shown in FIG. 1A, a collector contact layer 12 of n-type gallium arsenide (GaAs), a collector layer 13 of n-type GaAs, a base layer 14 of p-type GaAs, an emitter layer 15 of n-type indium gallium phosphorus (InGaP) and an emitter contact layer 16 of n-type indium gallium arsenide (InGaAs) are formed in this order over a substrate 11 of GaAs, for example.

In this embodiment, part of the base layer 14 located under the emitter layer 15 and actually functioning as a base is an intrinsic base region 14a and part of the base layer 14 located at the sides of the intrinsic base region 14a and not having a function as a base is an extrinsic base region 14b.

The emitter layer 15 and the emitter contact layer 16 are stacked over the base layer 14 to have a mesa configuration. An emitter electrode 17 of tungsten silicide (WSi) is formed on the emitter contact layer 16.

A capacitive film 18 of n-type InGaP and base electrodes 19 of a multilayer film as a stack of titanium, platinum and gold (Ti/Pt/Au) are provided on the extrinsic base region 14b of the base layer 14 each at a distance from the emitter layer 15. In this embodiment, the capacitive film 18 is provided in part of the extrinsic base region 14b near the intrinsic base region 14a. Each of the base electrodes 19 is provided on both of the extrinsic base region 14b and the capacitive film 18 to cover an end of the capacitive film 18 opposite to the emitter layer 15.

The collector layer 13 and the base layer 14 are formed to have their edges located within the collector contact layer 12. A collector electrode 20 of a metallic material is formed on an end portion of the collector layer 12.

Specific composition, impurity concentration and thickness of the semiconductor layers described above are shown in Table 1.

TABLE 1

| Semiconductor layer | Semiconductor material | Impurity concentration ($cm^{-3}$) | Thickness (nm) |
|---|---|---|---|
| Emitter contact layer | n-type $In_{0.5}Ga_{0.5}As$ | $2 \times 10^{19}$ | 200 |
| | n-type GaAs | $3 \times 10^{18}$ | |
| Emitter layer | n-type $In_{0.5}Ga_{0.5}P$ | $3 \times 10^{17}$ | 50 |
| Base layer | p-type GaAs | $4 \times 10^{19}$ | 70 |
| Collector layer | n-type GaAs | $3 \times 10^{16}$ | 700 |
| Collector contact layer | n-type GaAs | $5 \times 10^{18}$ | 500 |

As shown in Table 1, the collector contact layer 12 is made of n-type GaAs having an n-type impurity concentration of about $5 \times 10^{18}$ $cm^{-3}$ and a thickness of about 500 nm. The collector layer 13 is made of n-type GaAs having an n-type impurity concentration of about $3 \times 10^{16}$ $cm^{-3}$ and a thickness of about 700 nm. The base layer 14 is made of p-type GaAs having a p-type impurity concentration of about $4 \times 10^{19}$ $cm^{-3}$ and a thickness of about 70 nm. The emitter layer 15 is made of $In_{0.5}Ga_{0.5}P$ having an n-type impurity concentration of about $3 \times 10^{17}$ $cm^{-3}$ and a thickness of about 50 nm. The emitter contact layer 16 is made of a multilayer film in which an n-type GaAs layer having an n-type impurity concentration of about $3 \times 10^{18}$ $cm^{-3}$ and a thickness of about 100 nm, an n-type $In_xGa_{1-x}$ As layer having a thickness of about 50 nm, an n-type impurity concentration varying from $3 \times 10^{18}$ $cm^{-3}$ to $2 \times 10^{19}$ $cm^{-3}$ in the direction from the bottom to the top and a mole fraction x of indium (In) varying from 0 to 0.5, and an n-type $In_{0.5}Ga_{0.5}$As layer having an n-type impurity concentration of $2 \times 10^{19}$ $cm^{-3}$ and a thickness of about 50 nm, are stacked in this order.

As the emitter layer 15, the capacitive film 18 is made of $In_{0.5}Ga_{0.5}P$ having an n-type impurity concentration of about $3 \times 10^{17}$ $cm^{-3}$ and a thickness of about 50 nm and is formed to have a width (i.e., the dimension in the outward direction from the emitter layer 15) of about 1 µm.

The bipolar transistor of the first embodiment is characterized in that the capacitive film 18 is provided between the base layer 14 and the base electrodes 19. Since the base layer 14 is doped with a p-type impurity at a concentration much higher than the concentration of the n-type impurity in the capacitive film 18, a depletion layer is formed almost throughout the capacitive film 18. Accordingly, the capacitive film 18 can be used as a dielectric between the base electrodes 19 and the base layer 14.

Hereinafter, features of the bipolar transistor of the first embodiment will be described in detail with reference to FIG. 1B.

Figure 1B:
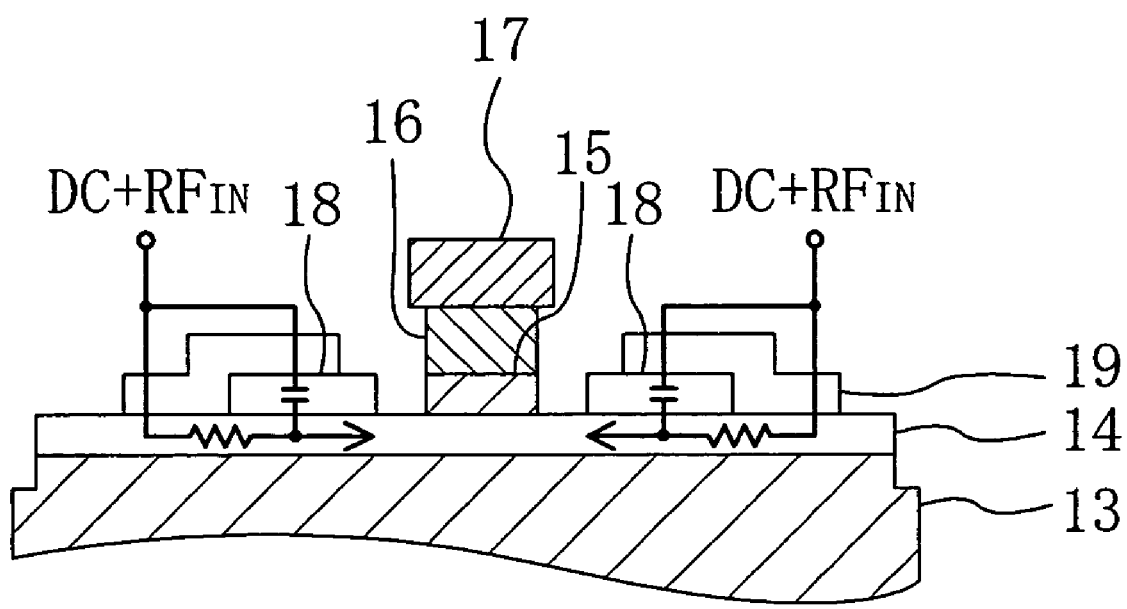
FIG. 1B is a diagram showing a portion of the bipolar transistor shown in FIG. 1A in an enlarged manner by overlaying equivalent circuit symbols thereon.

FIG. 1B shows the base electrodes 19 and a peripheral portion thereof in FIG. 1A in an enlarged manner, by overlaying equivalent circuit symbols thereon.

As shown in FIG. 1B, an RF input signal $RF_{IN}$ and a direct current DC are input to each of the base electrodes 19 and then input to the intrinsic base region 14a through the extrinsic base region 14b. In this case, the path along which the direct current DC and the RF input signal $RF_{IN}$ input to the base electrodes 19 reaches the intrinsic base region 14a includes: a first path along which the direct current DC and the RF input signal $RF_{IN}$ are directly input to the extrinsic base region 14b from the base electrodes 19 and then reach the intrinsic base region 14a through a portion under the capacitive film 18; and a second path along which the direct current DC and the RF input signal $RF_{IN}$ are input from each of the base electrodes 19 to the extrinsic base region 14b through the capacitive film 18 and then reach the intrinsic base region 14a. With respect to the first path, the extrinsic base region 14b serves as a resistor. On the other hand, with respect to the second path, the base electrodes 19, the dielectric film 18 and the extrinsic base region 14b serve as an upper electrode, a dielectric film and a lower electrode, respectively, together constituting a capacitor.

As described above, the capacitive film 18 is provided between the base layer 14 and the base electrodes 19 at an end of each of the base electrodes 19 nearest the emitter layer 15, so that a capacitor connected to a base resistor in parallel is achieved. Accordingly, the RF input signal $RF_{IN}$ input to the base electrodes 19 reaches the intrinsic base region 14a through the capacitor, so that the loss of electric power caused by the base resistance is reduced. In addition, even if the amount of the direct current DC increases, the voltage drops because of the resistor at the extrinsic base region 14b, thus suppressing temperature rise in the intrinsic base region 14a.

More specifically, in the case where the capacitive film 18 and the emitter layer 15 are made of the same semiconductor material and the capacitive film 18 is formed to have a thickness of about 50 nm and an area of about 80 µm², the capacitance of the capacitive film 18 is about 0.18 pF. In this case, if about 100 units of HBTs of the first embodiment are connected in parallel to be used for a high power device using an RF signal, the input capacitance is about 18 pF. Accordingly, it is possible to secure the input capacitance of the power amplifier so as not to deteriorate the RF characteristic thereof For example, in the case where the input signal $RF_{IN}$ has a frequency in the range from 800 kHz to 2 GHz, if the capacitive film 18 has a thickness of about 50 to 300 nm and a width of about 1 to 4 µm, it is possible to secure a sufficient input capacitance so as not to deteriorate the RF characteristic of the input signal $RF_{IN}$.

In addition, if the width of the capacitive film 18 is adjusted, the distance of the path passing through the extrinsic base region 14b directly from the base electrodes 19 is accordingly adjusted, so that it is possible to appropriately set the resistance value. Accordingly, if the base resistance is used as a ballast resistance, the thermal stability of the bipolar transistor can be improved.

In the first embodiment, the capacitor is obtained as a pn junction capacitance by using n-type InGaP as a material for the capacitive film 18. However, the present invention is not limited to this structure, and a dielectric material such as silicon nitride may be used. It should be noted that if the capacitive film 18 and the emitter layer 15 are made of the same semiconductor material, the capacitive film 18 and the emitter layer 15 can be formed at the same time, so that the manufacturing cost of the bipolar transistor can be reduced.

In the first embodiment, the bipolar transistor having an emitter-up configuration in which an emitter layer is provided on a base layer is described. Alternatively, the bipolar transistor may have a collector-up configuration in which an emitter layer is provided under a base layer and a collector layer is provided above the base layer.

The composition and thickness of the semiconductor layers constituting the bipolar transistor of the first embodiment are not necessarily set as shown in Table 1, and may be appropriately set so as to be suitable for transistor operation. In addition, the InGaP/GaAs-based bipolar transistor using InGaP in its emitter layer is described in the first embodiment.

In the first embodiment, the InGaP/GaAs-based bipolar transistor in which the base layer 14 is made of GaAs and the emitter layer 15 is made of InGaP is described. Alternatively, an AlGaAs/GaAs-based, InAlAs/InGaAs-based or InP/InGaAs-based bipolar transistor, for example, may be formed by changing materials for the base layer 14 and the emitter layer 15.

The base electrodes 19 are made of the multilayer film in which titanium, platinum and gold are stacked. However, the base electrodes 19 are not limited to this structure. Alternatively, tungsten silicide (WSi) and molybdenum (Mo) may be used for the lowermost layer of the base electrodes 19 and titanium, platinum and gold may be stacked thereon, for example. Then, thermal reaction between the base electrodes 19 and the capacitive film 18 may be suppressed.

Fabrication Mehtod of Embodiment 1

Hereinafter, a method for fabricating the bipolar transistor of the first embodiment will be described with reference to the drawings.

FIGS. 2A through 2D and FIGS. 3A through 3C are cross-sectional views showing respective process steps of a method for fabricating the bipolar transistor of the first embodiment.

Figure 2A:
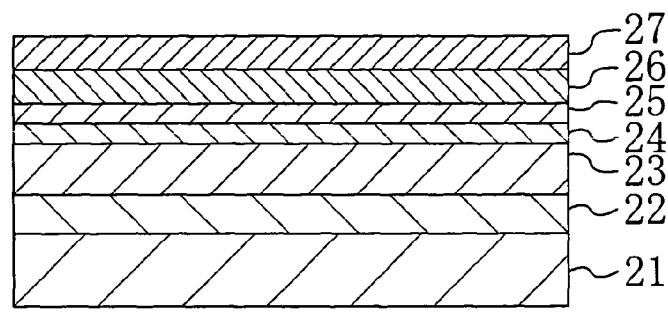
FIGS. 2A through 2D are cross-sectional views showing respective process steps of a method for fabricating the bipolar transistor of the first embodiment.

First, as shown in FIG. 2A, a collector contact layer 22 of GaAs doped with an n-type impurity, a collector-layer formation layer 23 of GaAs doped with a low-concentration n-type impurity, a base-layer formation layer (first semiconductor layer) 24 of GaAs doped with a high-concentration p-type impurity, an emitter-layer formation layer (second semiconductor layer) 25 of InGaP doped with an n-type impurity, and an emitter-contact-layer formation layer 26 of InGaAs which contains an n-type impurity and whose indium mole fraction gradually increases from 0 to 0.5 are formed by epitaxial growth over a substrate 21 of GaAs. Then, an emitter-electrode formation layer 27 of WSi is formed by a sputtering process over the emitter-contact-layer formation layer 26.

It is assumed that the composition and thickness of the semiconductor layers that have been epitaxially grown are the same as those shown in Table 1.

Figure 2B:
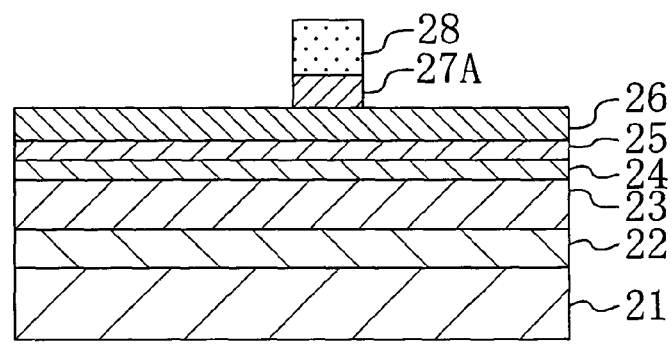

Next, as shown in FIG. 2B, a first resist pattern 28 is formed by a lithography process on the emitter-electrode formation layer 27 to cover an emitter electrode region.

Thereafter, a reactive ion etching (RIE) process using the first resist pattern 28 is performed to etch the emitter-electrode formation layer 27 until the emitter-contact-layer formation layer 26 is exposed. In this manner, an emitter electrode 27 A is formed out of the emitter-electrode formation layer 27.

Figure 2C:
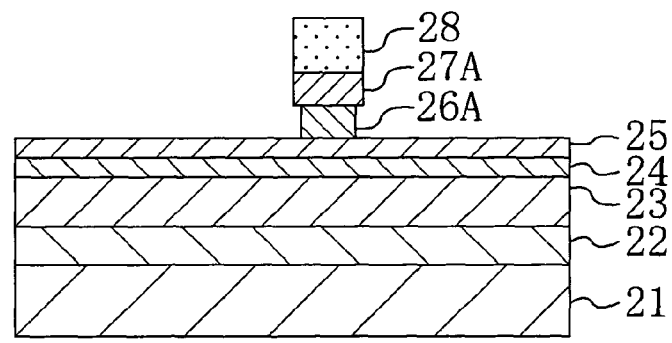

Then, as shown in FIG. 2C, a wet etching or dry etching process is performed using the first resist pattern 28 and the emitter electrode 27A as a mask to etch the emitter-contact-layer formation layer 26 until the emitter-layer formation layer 25 is exposed. In this manner, an emitter-contact layer 26A is formed out of the emitter-contact-layer formation layer 26. In this case, side etching occurs during the etching process performed on the emitter-contact-layer formation layer 26, so that the emitter-contact layer 26A is formed in a region inside the emitter electrode 27A.

Figure 2D:
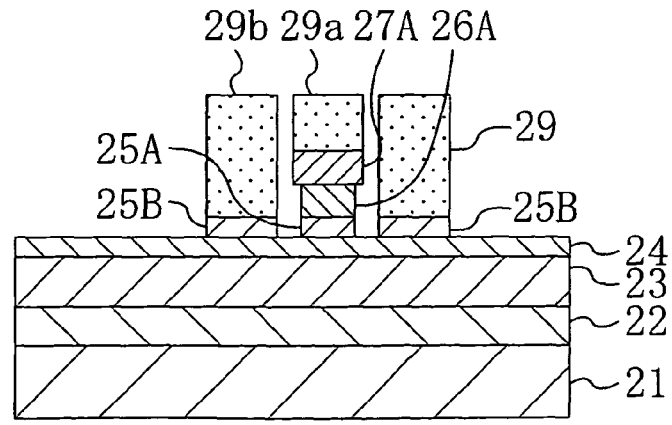

Subsequently, as shown in FIG. 2D, the first resist pattern 28 is removed, and then a second resist pattern 29 including: a first mask portion 29a covering the emitter electrode 27A; and a second mask portion 29b covering a region of the emitter-layer formation layer 25 located at a side of the emitter electrode 27A with a space provided therebetween. Thereafter, a dry etching process is performed using the second resist pattern 29 to etch the emitter-layer formation layer 25 until the base-layer formation layer 24 is exposed. In this manner, an emitter layer 25A is formed out of the emitter-layer formation layer 25 under the first mask portion 29a, and a capacitive film 25B is formed out of the emitter-layer formation layer 25 under the second mask portion 29b.

Figure 3A:
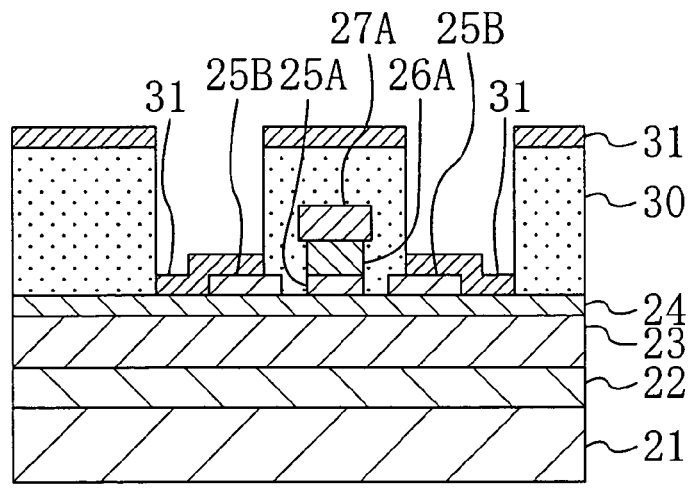
FIGS. 3A through 3C are cross-sectional views showing respective process steps of the method for fabricating the bipolar transistor of the first embodiment.

Then, as shown in FIG. 3A, the second resist pattern 29 is removed, and then a third resist pattern 30 having an opening 30a in which respective parts of the capacitive film 25B and the base-layer formation layer 24 are exposed is formed by a lithography process on the base-layer formation layer 24. Subsequently, Ti, Pt and Au are stacked in this order by an electron beam evaporation process over the entire surface of the third resist pattern 30 including the opening, thereby forming a base-electrode formation layer 31.

Figure 3B:
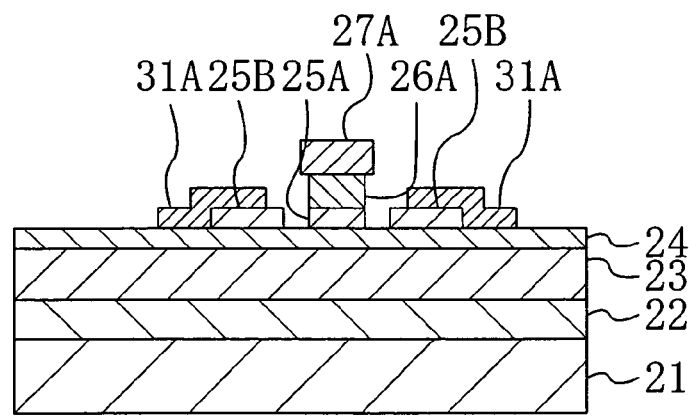

Thereafter, as shown in FIG. 3B, the third resist pattern 30 is removed with an organic solvent, for example. In this manner, a base electrode 31A is formed out of the base-electrode formation layer 31.

Figure 3C:
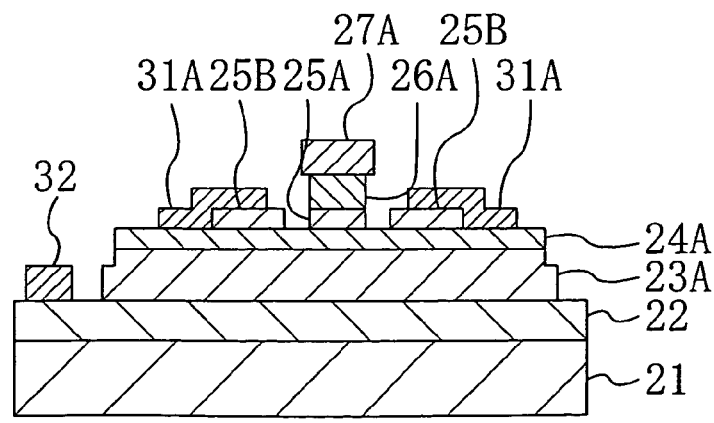

Then, as shown in FIG. 3C, the base-layer formation layer 24 and the collector-layer formation layer 23 are patterned in this order until the collector-contact layer 22 is exposed, thereby forming a base layer 24A out of the base-layer formation layer 24 and a collector layer 23A out of the collector-layer formation layer 23. Subsequently, a collector electrode 32 is formed on the exposed surface of the collector-contact layer 22 using a lithography process and an electron beam evaporation process. Then, heat treatment is performed at a temperature of about 400° C., thereby changing each of the base electrode 31A and the collector electrode 32 into an alloy. In this manner, a bipolar transistor of the first embodiment as shown in FIG. 1A is completed.

With the method for fabricating the bipolar transistor of the first embodiment as described above, a capacitive film 25B is formed on the base-layer formation layer 24, and then a base electrode 31A is formed. Accordingly, a region to serve as a capacitor can be provided inside a bipolar transistor region, thus securing an input capacitance for an RF input signal without increasing the chip area.

In particular, the emitter layer 25A and the capacitive film 25B are formed out of the emitter-layer formation layer 25, so that the capacitive film 25B can be formed without using any special dielectric material. As a result, the capacitor can be formed with a low cost.

In the first embodiment, the emitter layer 25A and the capacitive film 25B are formed out of the emitter-layer formation layer 25. However, the present invention is not limited to this structure. For example, after the emitter layer 25A has been formed out of the emitter-layer formation layer 25, the capacitive film 25B may be formed using another dielectric material. Even in such a case, it is possible to provide a capacitor region to a base input terminal without increasing the chip area.

Embodiment 2

Hereinafter, a bipolar transistor according to a second embodiment of the present invention will be described with reference to the drawings.

Figure 4:
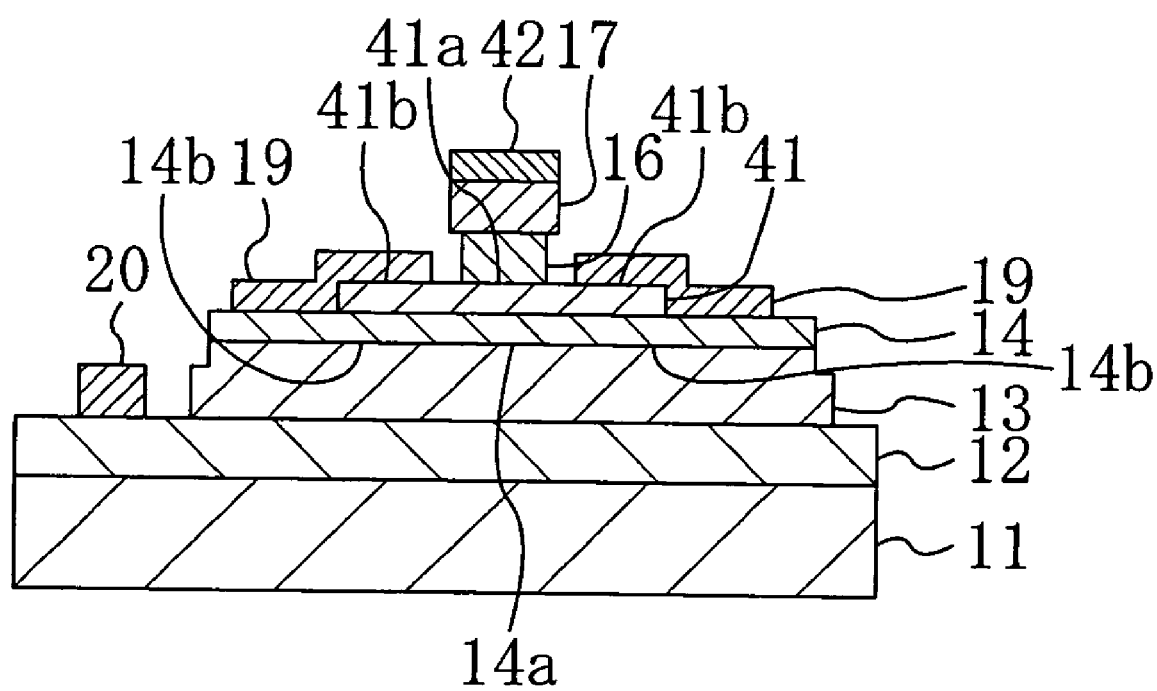
FIG. 4 is a cross-sectional view showing a structure of a bipolar transistor according to a second embodiment of the present invention.

FIG. 4 shows a cross-sectional structure of a bipolar transistor of the second embodiment. In FIG. 4, each member in the bipolar transistor of the first embodiment is identified by the same reference numeral and the description thereof will be omitted herein.

As shown in FIG. 4, a collector contact layer 12, a collector layer 13 and a base layer 14 including an intrinsic base region 14a and an extrinsic base region 14b are provided in this order over a substrate 11. An emitter layer 41 including an emitter region 41a on the intrinsic base region 14a and a surface-protection region 41b on the extrinsic base region 14b. An emitter contact layer 16, an emitter electrode 17 and an upper emitter electrode 42 of a multilayer film as a stack of titanium, platinum and gold (Ti/Pt/Au) are formed in this order over the emitter region 41a of the emitter layer 41.

Base electrodes 19 of Ti/Pr/Au are formed on the extrinsic base region 14b of the base layer 14 and each of the base electrodes 19 extends along a side of the emitter layer 41 to cover part of the upper surface of the emitter layer 41. A collector electrode 20 is provided on the collector contact layer 12.

The composition and thickness of the semiconductor layers of the second embodiment are the same as those of the first embodiment shown in Table 1.

In the bipolar transistor of the second embodiment, the surface-protection region 41b is provided, so that recombination between electrons injected from the emitter electrode 17 and holes in the extrinsic base region 14b outside the emitter region 41a is prevented. Accordingly, the current gain of the bipolar transistor can be increased, as compared to that in the first embodiment.

In addition, the base layer 14 is doped with a p-type impurity at a concentration much higher than the concentration of the n-type impurity in the emitter layer 41, so that a depletion layer is formed almost throughout the surface-protection region 41b in the depth direction. Accordingly, the surface-protection region 41b serves as a dielectric film of a capacitor, as the capacitive film 18 of the first embodiment.

In the second embodiment, the upper emitter electrode 42 is provided on the emitter electrode 17. Alternatively, the upper emitter electrode 42 may be omitted.

In the second embodiment, the emitter layer 41 including the emitter region 41a and the surface-protection region 41b is provided. Alternatively, the emitter layer and the capacitive film may be provided as in the first embodiment such that an end of the capacitive film at the side of the emitter layer is in contact with the emitter layer so as to use the capacitive film as a surface-protection region.

Fabrication Method of Embodiment 2

Hereinafter, a method for fabricating the bipolar transistor of the second embodiment will be described with reference to the drawings.

FIGS. 5A through 5D are cross-sectional views showing respective process steps of a method for fabricating the bipolar transistor of the second embodiment. In FIGS. 5A through 5D, each member in the bipolar transistor of the first embodiment is identified by the same reference numeral and the description thereof will be omitted herein. A process step shown in FIG. 5A corresponds to the process step shown in FIG. 2D regarding the first embodiment.

First, as in the process steps shown in FIGS. 2A through 2C, a collector contact layer 22, a collector-layer formation layer 23, a base-layer formation layer 24, an emitter-layer formation layer 25, an emitter-contact-layer formation layer 26 and an emitter-electrode formation layer 27 are stacked in this order over a substrate 21. Thereafter, etching is performed using a first resist pattern 28, thereby forming an emitter electrode 27A out of the emitter-electrode formation layer 27. Subsequently, an emitter contact layer 26A is formed out of the emitter-contact-layer formation layer 26.

Figure 5A:
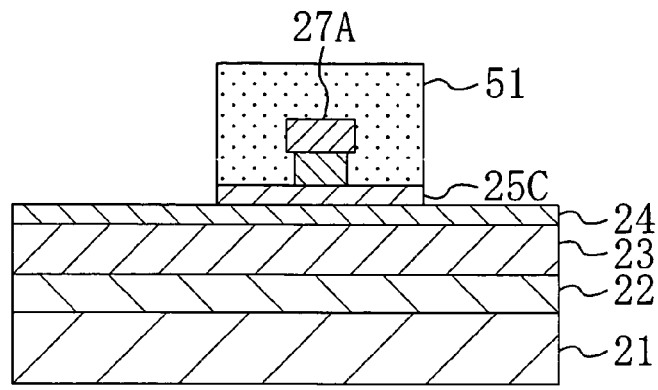
FIGS. 5A through 5D are cross-sectional views showing respective process steps of a method for fabricating the bipolar transistor of the second embodiment.

Next, as shown in FIG. 5A, a second resist pattern 51 is formed by a lithography process on the emitter-layer formation layer 25 to cover a region including the emitter electrode 27A. Thereafter, a dry etching process is performed using the second resist pattern 51 to etch the emitter-layer formation layer 25 until the base-layer formation layer 24 is exposed. In this manner, an emitter layer 25C including an emitter region and a surface-protection region is formed out of the emitter-layer formation layer 25.

Figure 5B:
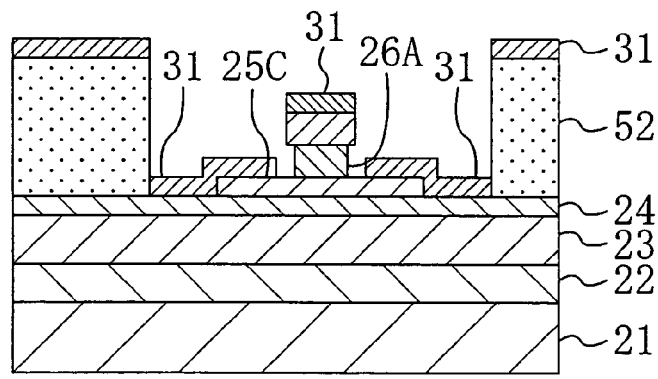

Then, as shown in FIG. 5B, the second resist pattern 51 is removed, and then a third resist pattern 52 having an opening in which the emitter electrode 27A and the emitter layer 25C are exposed is formed by a lithography process on the base-layer formation layer 24. Subsequently, a first metal film 31 of Ti, Pt and Au is formed by, for example, an electron beam evaporation process over the entire surface of the third resist pattern 52 including the opening.

Figure 5C:
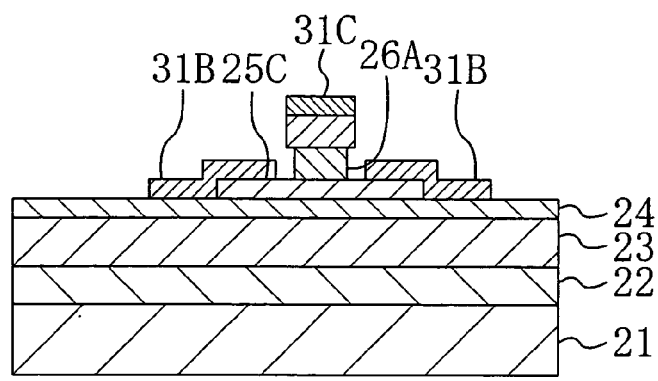

Thereafter, as shown in FIG. 5C, the third resist pattern 52 is removed with an organic solvent, for example. In this manner, a base electrode 31B and an upper emitter electrode 31C are formed out of the first metal film 31.

Figure 5D:
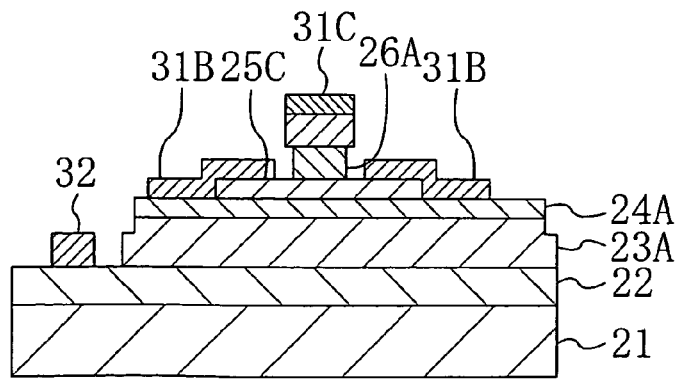

Then, as shown in FIG. 5D, the base-layer formation layer 24 and the collector-layer formation layer 23 are patterned in this order until the collector-contact layer 22 is exposed, thereby forming a base layer 24A out of the base-layer formation layer 24 and a collector layer 23A out of the collector-layer formation layer 23. Subsequently, a collector electrode 32 is formed on the exposed surface of the collector-contact layer 22 using a lithography process and an electron beam evaporation process.

In this manner, the bipolar transistor of the second embodiment shown in FIG. 2 is completed.

With the method for fabricating a bipolar transistor of the second embodiment, an emitter layer 25C including an emitter region and a surface-protection region is formed and part of the surface-protection region is used as a capacitive film. Accordingly, in a process step of forming a base electrode 31B, the base electrode 31B can be self-aligned with the emitter electrode 27A. That is to say, alignment of the emitter electrode is unnecessary in the formation of the base electrode 31B in the second embodiment. Accordingly, it is possible to form the base electrode 31B easily as intended.

Embodiment 3

Hereinafter, a bipolar transistor according to a third embodiment of the present invention will be described with reference to the drawings.

Figure 6:
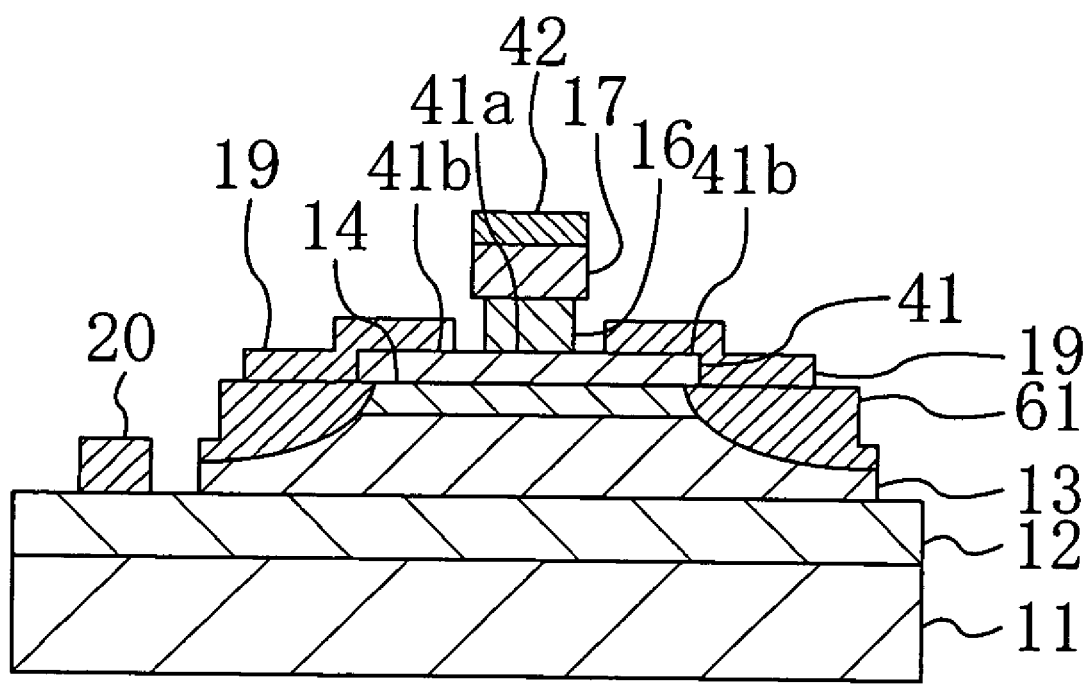
FIG. 6 is a cross-sectional view showing a structure of a bipolar transistor according to a third embodiment of the present invention.

FIG. 6 shows a cross-sectional structure of a bipolar transistor of the third embodiment. In FIG. 6, each member in the bipolar transistor of the second embodiment is identified by the same reference numeral and the description thereof will be omitted herein.

As shown in FIG. 6, the bipolar transistor of the third embodiment is different from that of the second embodiment in that a high-resistance region 61 is formed by implanting boron ions ($B^+$) into part of a collector layer 13 and a base layer 14 located outside an emitter layer 15.

In the bipolar transistor of the third embodiment, part of the base layer 14 in contact with base electrodes 19 is formed as a high-resistance region 61, so that a direct-current component of a direct current DC and an RF input signal $RF_{IN}$ input from the base electrodes 19 reaches an intrinsic base region 14a through the high-resistance region 61. Accordingly, the base resistance is made high as a ballast resistance with respect to the direct-current component. As a result, the thermal stability of the bipolar transistor can be improved.

In the third embodiment, ions implanted into the high-resistance region 61 are not limited to boron ions and may be ions of hydrogen, helium, oxygen, fluorine or argon.

In the third embodiment, the depth of the high-resistance region 61 is from the surface of the base layer 14 to around the top of the collector layer 13. However, the present invention is not limited to this specific embodiment and ions may be implanted only in a surface region of the base layer 14.

Fabrication Mehtod of Embodiment 3

Hereinafter, a method for fabricating the bipolar transistor of the third embodiment will be described with reference to the drawings.

FIGS. 7A through 7D are cross-sectional views showing respective process steps of a method for fabricating the bipolar transistor of the third embodiment. In FIGS. 7A through 7D, each member in the bipolar transistor of the first or second embodiment is identified by the same reference numeral and the description thereof will be omitted herein. A process step shown in FIG. 7A corresponds to the process step shown in FIG. 5A regarding the second embodiment.

First, as in the process steps shown in FIGS. 2A through 2C, a collector contact 22, a collector-layer formation layer 23, a base-layer formation layer 24, an emitter-layer formation layer 25, an emitter-contact-layer formation layer 26 and an emitter-electrode formation layer 27 are stacked in this order over a substrate 21. Thereafter, etching is performed using a first resist pattern 28, thereby forming an emitter electrode 27A out of the emitter-electrode formation layer 27. Subsequently, an emitter contact layer 26A is formed out of the emitter-contact-layer formation layer 26.

Figure 7A:
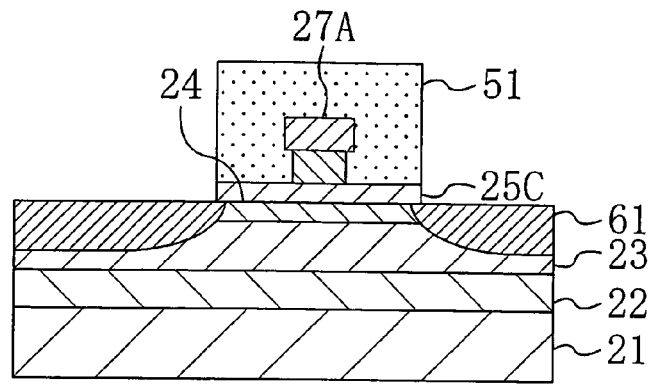
FIGS. 7A through 7D are cross-sectional views showing respective process steps of a method for fabricating the bipolar transistor of the third embodiment.

Next, as shown in FIG. 7A, a second resist pattern 51 is formed by a lithography process on the emitter-layer formation layer 25 to cover a region including the emitter electrode 27A. Thereafter, a dry etching process is performed using the second resist pattern 51 to etch the emitter-layer formation layer 25 until the base-layer formation layer 24 is exposed. In this manner, an emitter layer 25C including an emitter region 25a and a surface-protection region 25b is formed out of the emitter-layer formation layer 25.

Thereafter, ion implantation is performed on the exposed surface of the base-layer formation layer 24 using the second resist pattern 51 as a mask. In this case, boron ions ($B^+$) are implanted at two stages of conditions: with an implantation energy of about 30 keV at a doze of $3\times10^{12}$ $cm^{-2}$; and with an implantation energy of about 200 keV at a doze of $5\times10^{12}$ $cm^{-2}$. In this manner, a high-resistance region 61 is formed in the base-layer formation layer 24 and the collector-layer formation layer 23.

Figure 7B:
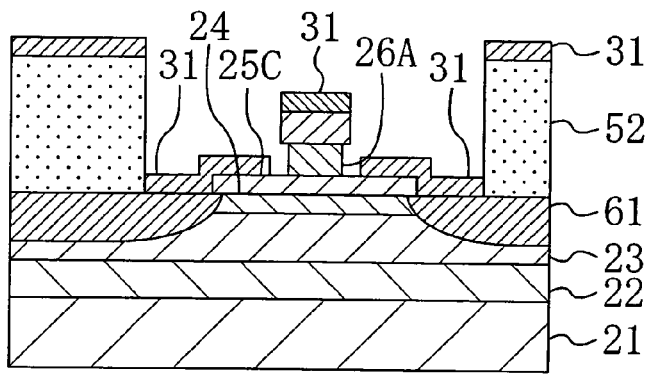

Then, as shown in FIG. 7B, the second resist pattern 51 is removed by a lithography process, and then a third resist pattern 52 having an opening in which the emitter electrode 27A and the emitter layer 25C are exposed is formed by a lithography process on the base-layer formation layer 24. Subsequently, a first metal film 31 of Ti, Pt and Au is formed by, for example, an electron beam evaporation process over the entire surface of the third resist pattern 52 including the opening.

Figure 7C:
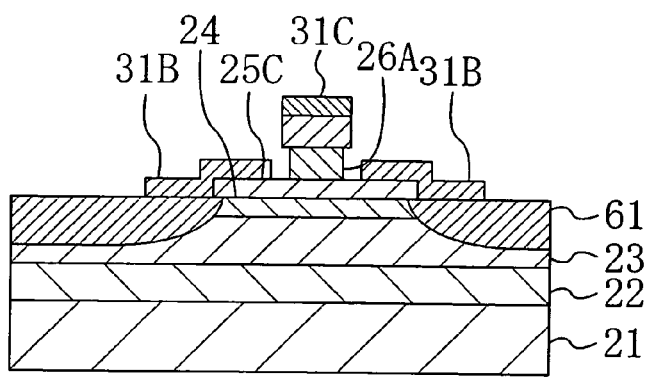

Thereafter, as shown in FIG. 7C, the third resist pattern 52 is removed with an organic solvent, for example. In this manner, a base electrode 31B and an upper emitter electrode 31C are formed out of the first metal film 31.

Figure 7D:
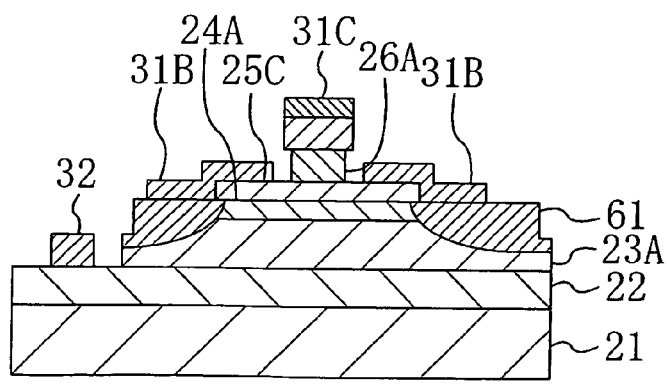

Then, as shown in FIG. 7D, the base-layer formation layer 24 and the collector-layer formation layer 23 are patterned in this order until the collector-contact layer 22 is exposed, thereby forming a base layer 24A out of the base-layer formation layer 24 and a collector layer 23A out of the collector-layer formation layer 23. Subsequently, a collector electrode 32 is formed on the exposed surface of the collector-contact layer 22 using a lithography process and an electron beam evaporation process.

In this manner, the bipolar transistor of the third embodiment shown in FIG. 6 is completed.

With the method for fabricating a bipolar transistor of the third embodiment, the second resist pattern 51 as a mask pattern used in forming the emitter layer 25C can be used as a mask for ion implantation. Accordingly, it is possible to form a high-resistance region 61 without using any special mask for ion implantation.

In the method for fabricating a bipolar transistor of the third embodiment, if the conditions for ion implantation are changed, the dimension of the high-resistance region 61 in the depth direction can be set at an appropriate value.

Embodiment 4

Hereinafter, a bipolar transistor according to a fourth embodiment of the present invention will be described with reference to the drawings.

Figure 8:
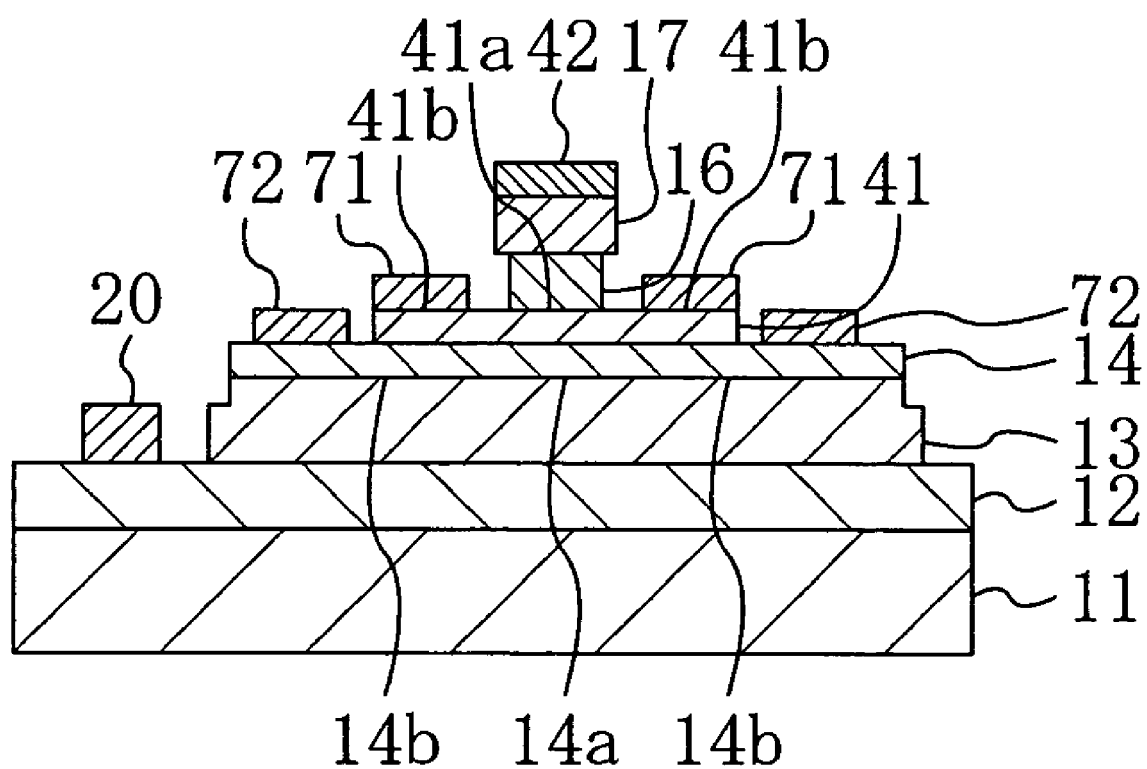
FIG. 8 is a cross-sectional view showing a structure of a bipolar transistor according to a fourth embodiment of the present invention.

FIG. 8 shows a cross-sectional structure of a bipolar transistor of the fourth embodiment. In FIG. 8, each member in the bipolar transistor of the second embodiment is identified by the same reference numeral and the description thereof will be omitted herein.

The bipolar transistor of the second embodiment has the configuration in which the base electrodes 19 are provided to cover the top of the base layer 14 and the surface-protection region 41b. On the other hand, the bipolar transistor of the fourth embodiment has the configuration in which two types of electrodes, i.e., first base electrodes 71 and second base electrodes 72 are provided on a surface-protection region 41b and a base layer 14, respectively, as shown in FIG. 8.

In the bipolar transistor of the second embodiment, the base electrodes are provided in contact with the sides of the surface-protection region 41b, so that current might flow into the intrinsic base region 14a through side portions of the surface-protection region 41b as a leakage current.

On the other hand, in the bipolar transistor of the fourth embodiment, base electrodes are separately provided on the surface-protection region 41b to be a capacitive film and on the extrinsic base region 14b. Accordingly, no direct current leaks from the side of the surface-protection region 41b into the base layer 14.

In particular, a configuration in which an RF input signal $RF_{IN}$ is input to the first base electrodes 71 and a direct current DC is input to the second base electrodes 72 ensures suppression of leakage current, thus making it possible to improve the RF characteristic.

In the fourth embodiment, the configuration in which the first base electrodes 71 are provided on the surface-protection region 41a is described. Alternatively, first base electrodes may be provided on the capacitive film 18 shown in FIG. 1A.

A method for fabricating the bipolar transistor of the fourth embodiment is implemented by changing the shape of the third resist pattern 52 in the process step shown in FIG. 5B in the method for fabricating the bipolar transistor of the second embodiment.

Modified Example of Embodiment 4

Hereinafter, a bipolar transistor according to a modified example of the fourth embodiment of the present invention will be described with reference to the drawings.

Figure 9:
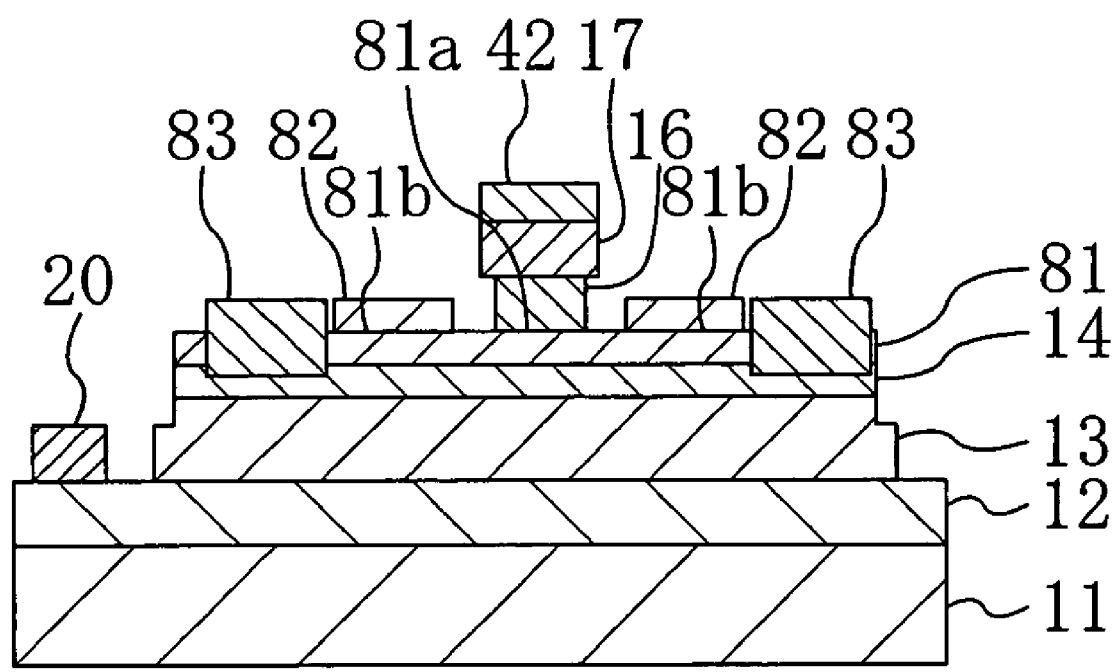
FIG. 9 is a cross-sectional view showing a structure of a bipolar transistor according to a modified example of the fourth embodiment.
Figure 10A:
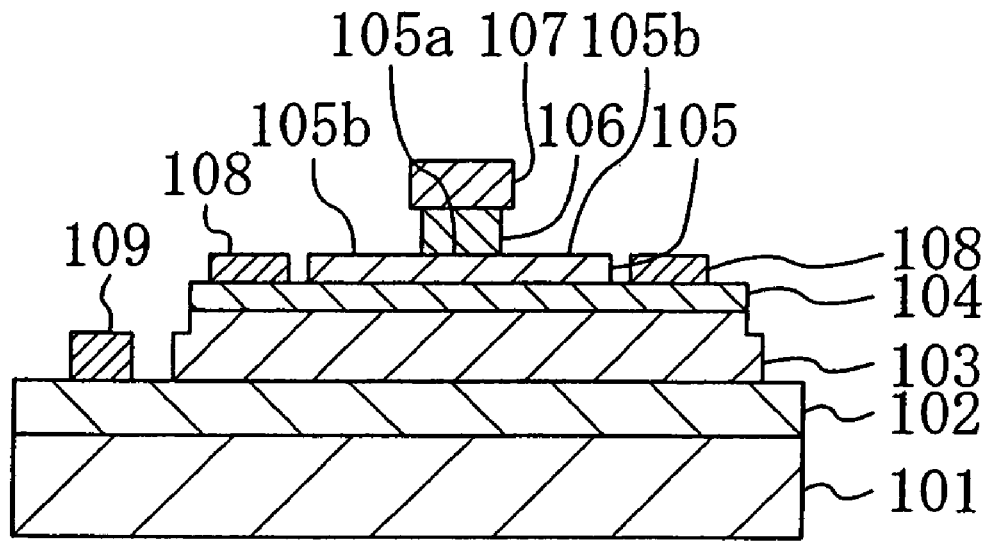
FIG. 10A is a cross-sectional view showing a structure of a known bipolar transistor.
Figure 10B:
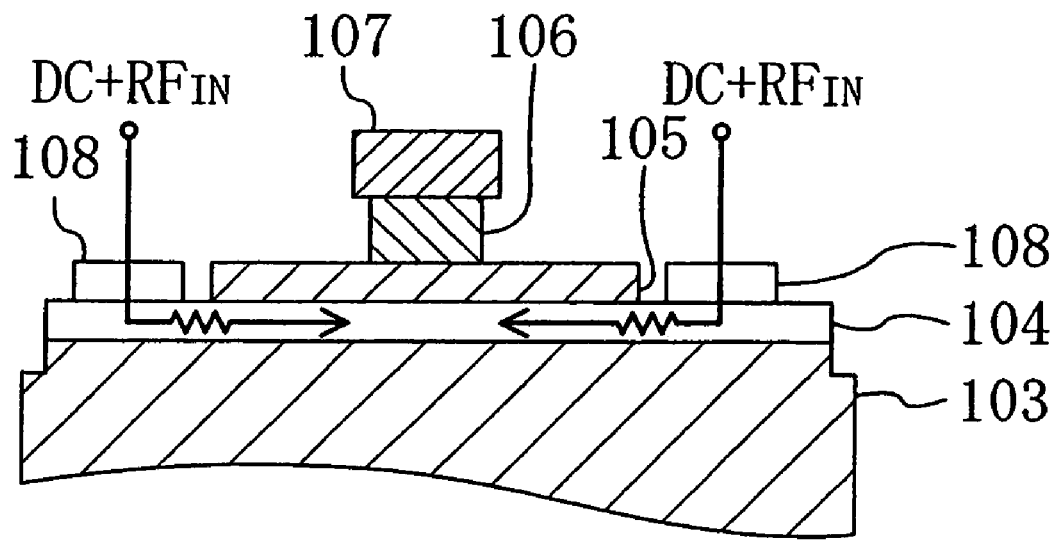
FIG. 10B is a diagram showing a portion of the bipolar transistor shown in FIG. 10A in an enlarged manner by overlaying equivalent circuit symbols thereon.
Figure 11:
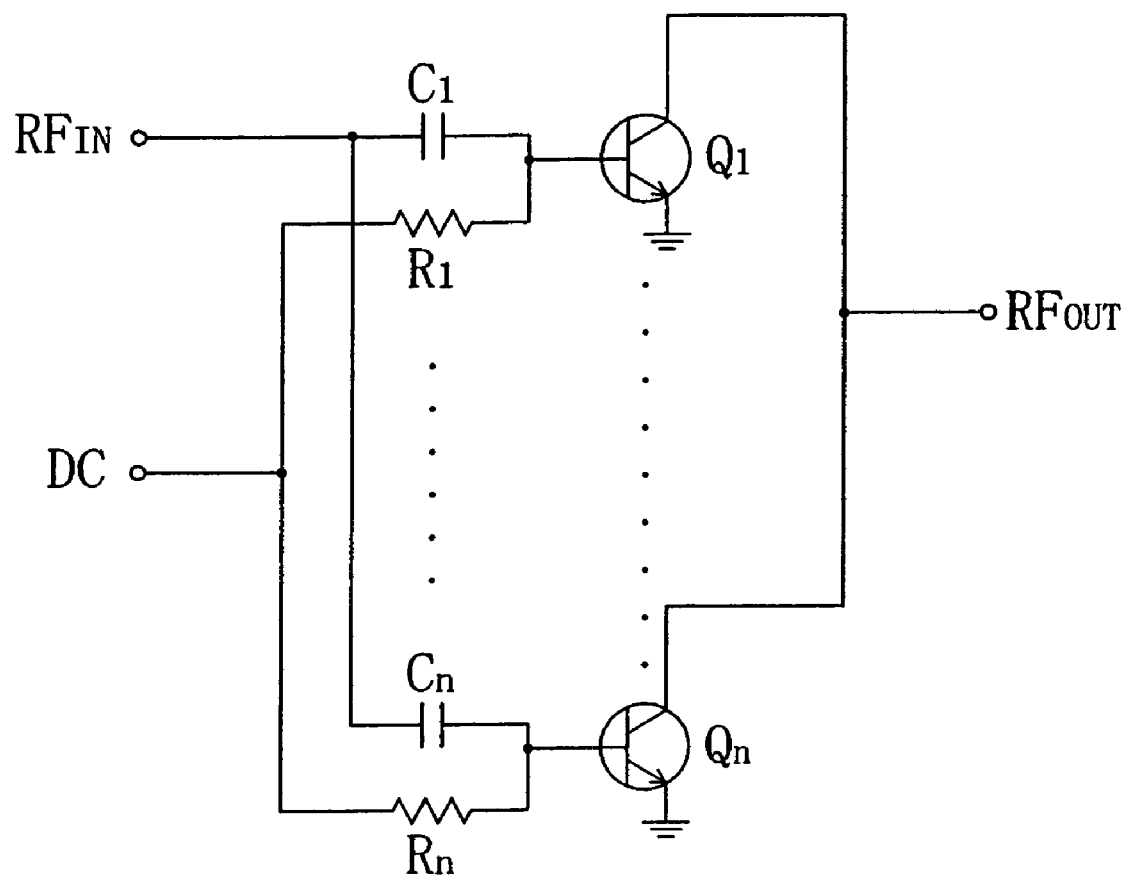
FIG. 11 is a circuit diagram showing a high power device using a known bipolar transistor.

FIG. 9 shows a cross-sectional structure of a bipolar transistor of the modified example of the fourth embodiment. In FIG. 9, each member in the bipolar transistor of the fourth embodiment is identified by the same reference numeral and the description thereof will be omitted herein.

In the bipolar transistor of the fourth embodiment, the emitter layer 41 is formed on the base layer 14 to have a mesa configuration and the second base electrodes are provided on the extrinsic base region. On the other hand, as shown in FIG. 9, the bipolar transistor of this modified example has the following configuration. An emitter layer 81 is provided over the entire surface of a base layer 14. First base electrodes 82 made of a multilayer film as a stack of tungsten silicon, titanium, platinum and gold (WSi/Ti/Pt/Au) are provided on respective parts of the emitter layer 81 near the emitter contact layer 16. Second base electrodes 83 made of a multilayer film as a stack of platinum, titanium, platinum and gold (Pt/Ti/Pt/Au) are provided through the emitter layer 81 to be in contact with an extrinsic base region 14b of the base layer 14.

In the bipolar transistor of this modified example, since the emitter layer 81 is provided over the entire surface of the base layer 14, recombination of electrons and holes in the surface of the base layer 14 is prevented as intended. Accordingly, the current gain of the bipolar transistor can be increased.

A method for fabricating the bipolar transistor of this modified example is implemented by separately forming masks for use in the process step of forming the first base electrodes 82 and the process step of forming the second base electrodes 83, in the process of forming base electrodes. Thereafter, if heat treatment is performed at a temperature of about 400° C. after the formation of a collector electrode, platinum constituting the lowermost layer of the second base electrodes diffuses within the emitter layer 81 to reach the base layer. Accordingly, the second base electrodes 82 come in contact with the base layer 14. The lowermost layers of the first base electrodes 82 are made of tungsten silicon, and tungsten silicon does not diffuse inside the emitter layer 81 by the heat treatment.

In the fourth embodiment and the modified example thereof, the second base electrodes are preferably made of a metallic material whose resistance value is in positive correlation to temperature. Specific examples of the metallic material include Cu—Ni and Ni—Cr. These materials may be used alone for the base electrode. Alternatively, in order to enhance the adhesion to the semiconductor material constituting the base layer, Ti or Cr, for example, may be used for an underlying layer so that a multilayer film of Ti and Cu—Ni or Ni—Cr or a multilayer film of Cr and Cu—Ni or Ni—Cr is used for the base electrode. Then, the resistance of a path along which direct current flows increases as the temperature rises, so that the ballast resistance at the base electrodes can be increased. Accordingly, thermal stability can be further improved.

What is claimed is:

1. A bipolar transistor comprising:
   a first semiconductor layer including an intrinsic base region and an extrinsic base region;
   a second semiconductor layer formed on the first semiconductor layer, wherein part of the second semiconductor layer located on the intrinsic base region forms an emitter region or a collector region;
   a capacitive film formed on the extrinsic base region of the first semiconductor layer; and
   a base electrode formed on the first semiconductor layer,
   wherein part of the base electrode is located on the capacitive film, and the other part of the base electrode is connected to the extrinsic base region adjacent the side of the capacitive film far from the intrinsic base region,
   a part of the capacitive film located under the base electrode serves as a depletion layer, and
   the capacitive film has a thickness of 300 nm or less and a width of 1 μm or more.

2. A bipolar transistor comprising:
   a first semiconductor layer including an intrinsic base region and an extrinsic base region;
   a second semiconductor layer formed on the first semiconductor layer, wherein part of the second semiconductor layer located on the intrinsic base region forms an emitter region or a collector region;
   a capacitive film formed on the extrinsic base region of the first semiconductor layer; and
   a base electrode formed on the first semiconductor layer,
   wherein part of the base electrode is located on the capacitive film, and the other part of the base electrode is connected to the extrinsic base region,
   the capacitive film and the second semiconductor layer comprise an identical semiconductor material,
   a part of the capacitive film located under the base electrode serves as a depletion layer, and
   the capacitive film has a thickness of 300 nm or less and a width of 1 μm or more.

3. A bipolar transistor comprising:
   a first semiconductor layer including an intrinsic base region and an extrinsic base region;
   a second semiconductor layer formed on the first semiconductor layer, wherein part of the second semiconductor layer located on the intrinsic base region forms an emitter region or a collector region;
   a capacitive film formed on the extrinsic base region of the first semiconductor layer; and
   a base electrode formed on the first semiconductor layer,
   wherein part of the base electrode is located on the capacitive film, and the other part of the base electrode is connected to the extrinsic base region, the capacitive film is provided such that an end of the capacitive film at the side of the second semiconductor layer is in contact with a side of the second semiconductor layer, a part of the capacitive film located under the base electrode serves as a depletion layer, and the capacitive film has a thickness of 300 nm or less and a width of 1 µm or more.

4. A bipolar transistor comprising:

a first semiconductor layer including an intrinsic base region and an extrinsic base region;

a second semiconductor layer formed on the first semiconductor layer, wherein part of the second semiconductor layer located on the intrinsic base region forms an emitter region or a collector region;

a capacitive film formed on the extrinsic base region of the first semiconductor layer; and a base electrode formed on the first semiconductor layer, wherein part of the base electrode is located on the capacitive film, and the other part of the base electrode is connected to the extrinsic base region, and wherein a high-resistance region having a resistance value higher than the intrinsic base region is provided in the extrinsic base region.

5. A bipolar transistor comprising:

a first semiconductor layer including an intrinsic base region and an extrinsic base region;

a second semiconductor layer formed on the first semiconductor layer, wherein part of the second semiconductor layer located on the intrinsic base region forms an emitter region or a collector region;

a capacitive film formed on the extrinsic base region of the first semiconductor layer; and a base electrode formed on the first semiconductor layer, wherein part of the base electrode is located on the capacitive film, and the other part of the base electrode is connected to the extrinsic base region adjacent the side of the capacitive film far from the intrinsic base region, a part of the capacitive film located under the base electrode serves as a depletion layer, the capacitive film is provided on part of the extrinsic base region located at a distance from an end of the extrinsic base region opposite to the intrinsic base region, and the base electrode is provided on the extrinsic base region and the capacitive film to cover an end of the capacitive film farthest from the second semiconductor layer.

6. A bipolar transistor comprising:

a first semiconductor layer including an intrinsic base region and an extrinsic base region;

a second semiconductor layer formed on the first semiconductor layer, wherein part of the second semiconductor layer located on the intrinsic base region forms an emitter region or a collector region;

a capacitive film formed on the extrinsic base region of the first semiconductor layer; and a base electrode formed on the first semiconductor layer, wherein part of the base electrode is located on the capacitive film, and the other part of the base electrode is connected to the extrinsic base region adjacent the side of the capacitive film farthest from the intrinsic base region, and the capacitive film comprises a depletion layer, wherein the base electrode includes:

a first base electrode formed on the capacitive film; and a second base electrode provided at a distance from the first base electrode and connected to the extrinsic base region of the first semiconductor layer.

7. A bipolar transistor comprising:

a first semiconductor layer including an intrinsic base region and an extrinsic base region;

a second semiconductor layer formed on the first semiconductor layer, wherein part of the second semiconductor layer located on the intrinsic base region forms an emitter region or a collector region;

a capacitive film formed on the extrinsic base region of the first semiconductor layer; and a base electrode formed on the first semiconductor layer, wherein part of the base electrode is located on the capacitive film, and the other part of the base electrode is connected to the extrinsic base region, wherein the base electrode includes:

a first base electrode formed on the capacitive film; and a second base electrode provided at a distance from the first base electrode and connected to the extrinsic base region of the first semiconductor layer, and the second base electrode comprises a metallic material whose resistance value increases as the temperature rises.

8. The bipolar transistor of claim 6, wherein the capacitive film is provided on part of the extrinsic base region located at a distance from an end of the extrinsic base region opposite to the intrinsic base region, and the second base electrode is provided on the extrinsic base region farthest from the intrinsic base region.

9. The bipolar transistor of claim 6, wherein the capacitive film is formed on the first semiconductor layer to cover an end of the extrinsic base region farthest from the intrinsic base region, the second base electrode is located at a larger distance from the intrinsic base region than the first base electrode, and the second base electrode is connected to the first semiconductor layer by penetrating the capacitive film.

10. The bipolar transistor of claim 1, wherein the second semiconductor layer is made of a semiconductor material exhibiting a band gap wider than the first semiconductor layer.

11. A bipolar transistor comprising:

a first semiconductor layer including an intrinsic base region and an extrinsic base region;

a second semiconductor layer formed on the first semiconductor layer, wherein part of the second semiconductor layer located on the intrinsic base region forms an emitter region or a collector region;

a capacitive film formed on the extrinsic base region of the first semiconductor layer; and a base electrode formed on the first semiconductor layer, wherein part of the base electrode is located on the capacitive film, and the other part of the base electrode is connected to the extrinsic base region, wherein the first semiconductor layer comprises a semiconductor material of a first conductivity type, the capacitive film comprises a semiconductor material of a second conductivity type, a part of the capacitive film located under the base electrode serves as a depletion layer, and the capacitive film has a thickness of 300 nm or less and a width of 1 µm or more.

* * * * *